US009258463B2

(12) United States Patent
Mitsui et al.

(10) Patent No.: US 9,258,463 B2
(45) Date of Patent: Feb. 9, 2016

(54) PHOTOELECTRIC CONVERSION ELEMENT AND IMAGING DEVICE

(71) Applicant: FUJIFILM CORPORATION, Tokyo (JP)

(72) Inventors: Tetsuro Mitsui, Ashigara-kami-gun (JP); Takuro Sugiyama, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/222,413

(22) Filed: Mar. 21, 2014

(65) Prior Publication Data

US 2014/0204259 A1   Jul. 24, 2014

Related U.S. Application Data

(63) Continuation of application No. PCT/JP2012/067844, filed on Jul. 12, 2012.

(30) Foreign Application Priority Data

Sep. 21, 2011   (JP) .................................. 2011-206125
Jul. 11, 2012   (JP) .................................. 2012-155912

(51) Int. Cl.
*H04N 5/225*   (2006.01)
*B82Y 10/00*   (2011.01)
(Continued)

(52) U.S. Cl.
CPC ................. *H04N 5/225* (2013.01); *B82Y 10/00* (2013.01); *H01L 27/307* (2013.01);
(Continued)

(58) Field of Classification Search
CPC .............................. H04N 5/225; H01L 27/307
See application file for complete search history.

(56) References Cited

U.S. PATENT DOCUMENTS 6,689,491 B1   2/2004   Nii et al.
7,570,292 B2 *   8/2009   Hioki ................ H01L 27/14647
                                                        348/294
(Continued)

FOREIGN PATENT DOCUMENTS

JP   2007-335840 A    12/2007
JP   2007335840 A  *  12/2007
(Continued)

OTHER PUBLICATIONS

An Office Action; "Decision of Refusal," issued by the Japanese Patent Office on Dec. 2, 2014, which corresponds to Japanese Patent Application No. 2012-155912 and is related to U.S. Appl. No. 14/222,413; with English language partial translation.
(Continued)

*Primary Examiner* — Ahmed A Berhan
(74) *Attorney, Agent, or Firm* — Studebaker & Brackett PC

(57) ABSTRACT

The solid-state imaging device includes lower electrodes acting as pixel electrodes, an organic photoelectric conversion film formed on the lower electrodes and generating electric charge in response to received light, and a transparent upper electrode that are formed on a substrate having signal readout circuits. The organic photoelectric conversion film, a transition area having at least one of its film thickness and film quality undergone transition from a film thickness and film quality of an area corresponding to a pixel electrode area in which the lower electrodes have been formed is an area that starts from an outer edge of the organic photoelectric conversion film and ends at a point away from the outer edge by a distance of 200 μm or less.

14 Claims, 6 Drawing Sheets

(51) Int. Cl.
*H01L 27/30* (2006.01)
*H01L 51/00* (2006.01)
*H01L 51/42* (2006.01)

(52) U.S. Cl.
CPC .......... *H01L 51/006* (2013.01); *H01L 51/0046* (2013.01); *H01L 51/0053* (2013.01); *H01L 51/0058* (2013.01); *H01L 51/0072* (2013.01); *H01L 51/4273* (2013.01); *H01L 2251/308* (2013.01)

(56) References Cited

U.S. PATENT DOCUMENTS

| 8,390,036 | B2* | 3/2013 | Goto | H01L 27/307 257/214 |
|---|---|---|---|---|
| 2004/0086748 | A1 | 5/2004 | Nii et al. | |
| 2005/0065351 | A1 | 3/2005 | Nii et al. | |
| 2011/0049665 | A1* | 3/2011 | Goto | 257/459 |

FOREIGN PATENT DOCUMENTS

| JP | 2008-288253 A | 11/2008 |
|---|---|---|
| JP | 4213832 B2 | 11/2008 |
| JP | 2009-212468 A | 9/2009 |
| JP | 2011-054746 A | 3/2011 |

OTHER PUBLICATIONS

An Office Action; "Notification of Reasons for Refusal," issued by the Japanese Patent Office on Feb. 18, 2014, which corresponds to Japanese Patent Application No. 2012-155912 and is related to U.S. Appl. No. 14/222,413; with English language partial translation.

Notification of Transmittal of Translation of the International Preliminary Report on Patentability and Translation of Written Opinion of the International Searching Authority; PCT/JP2012/067844 issued on Apr. 3, 2014.

International Search Report; PCT/JP2012/067844; Sep. 11, 2012.

An Office Action issued by the Korean Patent Office on Aug. 7, 2015, which corresponds to Korean Patent Application No. 10-2014-7007323 and is related to U.S. Appl. No. 14/222,413; with English language partial translation.

* cited by examiner

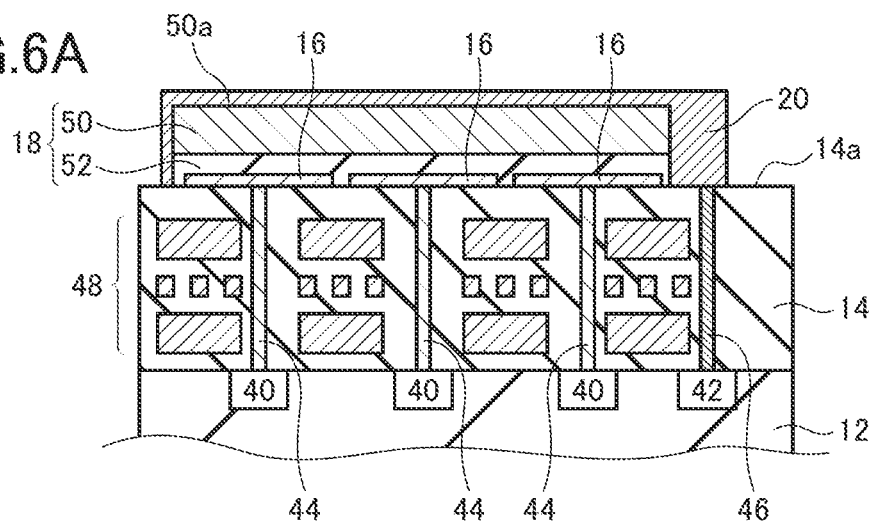
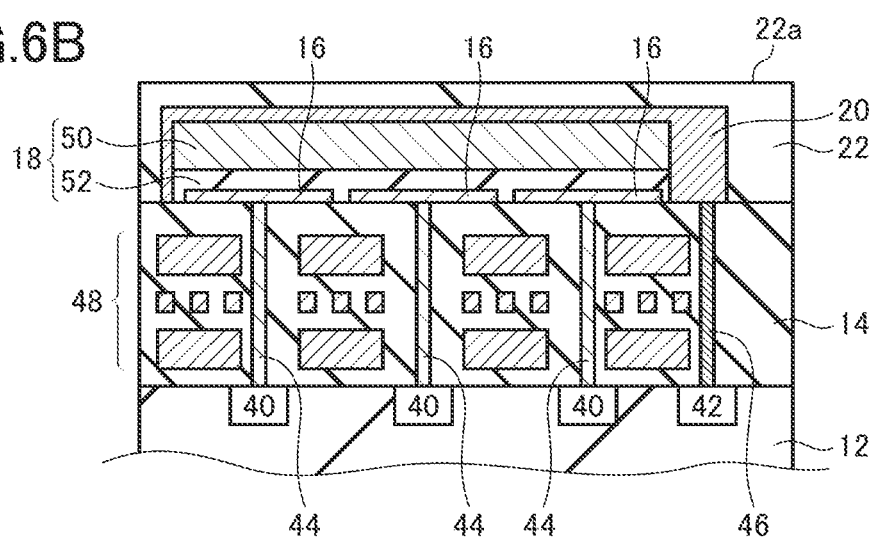

PHOTOELECTRIC CONVERSION ELEMENT AND IMAGING DEVICE

CROSS REFERENCE TO RELATED APPLICATIONS

This application is a continuation application of International Application PCT/JP2012/067844 filed on Jul. 12, 2012 which claims priority under 35 U.S.C. 119(a) to Application No. 2011-206125 filed on Sep. 21, 2011 in Japan and Application No. 2012-155912 filed on Jul. 11, 2012 in Japan, all of which are hereby expressly incorporated by reference into the present application.

BACKGROUND OF THE INVENTION

The present invention relates to a solid-state imaging device having an organic photoelectric conversion layer that generates electric charge in response to received light. Particularly, the present invention relates to a solid-state imaging device having a high degree of heat resistance.

As image sensors used for digital still cameras, digital video cameras, cameras for cellular phones, cameras for endoscopes, and the like, solid-state imaging devices (so-called CCD sensors and CMOS sensors), in which pixels having photodiodes are arranged on a semiconductor substrate such as a silicon (Si) chip, and signal electric charge corresponding to photoelectrons generated by the photodiode of each pixel is obtained by a CCD-type or CMOS-type readout circuit, are widely known.

As solid-state imaging devices, planar photodetectors, in which photoelectric conversion portions two-dimensionally arranged in a semiconductor are used as pixels and signals generated by photoelectric conversion in the respective pixels are electric charge-transferred and read out by a CCD or CMOS mode, are widely used. Conventionally, the photoelectric conversion portion is generally formed by making a PN junction in a semiconductor such as Si.

In recent years, as the number of pixels has been increased, the pixel size has been further reduced. Accordingly, the area of a photodiode portion has been reduced, and this has led to problems such as decrease in aperture ratio and light-collecting efficiency. As a technique of improving the aperture ratio, and the like, solid-state imaging devices having an organic photoelectric conversion layer using an organic material are being examined.

The solid-state imaging device having an organic photoelectric conversion layer is configured with pixel electrodes formed on a semiconductor substrate in which signal readout circuits are formed, an organic photoelectric conversion layer formed on the pixel electrodes, a counter electrode formed on the organic photoelectric conversion layer, and a sealing layer formed on the counter electrode, color filters, and the like.

In the solid-state imaging device, when bias voltage is applied between the pixel electrodes and the counter electrode, an exciton generated inside the organic photoelectric conversion layer is dissociated into an electron and a hole, and a signal corresponding to the electric charge of the electron or hole that has moved to the pixel electrodes according to the bias voltage is obtained by a CCD-type or CMOS-type signal readout circuit.

SUMMARY OF THE INVENTION

In preparing a solid-state imaging device having an organic photoelectric conversion layer, all performance including sensitivity, dark currents, and response performance (residual image) need to become satisfactory.

In the solid-state imaging device, after the organic photoelectric conversion layer is formed, for example, a sealing layer (protective film) for blocking the outside air (water and oxygen), color filters disposed on the photoelectric conversion film, other functional films, and the like are formed in the form of films on the organic photoelectric conversion layer in some cases, such that the solid-state imaging device carries out its function. In this case, for example, for forming the color filters, a step of coating chemical agents for forming the color filters and heating the resultant generally at about 200° C. for curing is performed on the organic photoelectric conversion layer. Moreover, heating is also performed at the time of wire bonding for electrically connecting a substrate circuit to a package, die bonding of a chip to a package, reflow soldering for connecting a package to an IC substrate, and the like.

Furthermore, for performing the aforementioned wire bonding, a PAD opening portion needs to be placed in the periphery and the like of the chip. At this time, forming of a resist pattern and etching are conducted, and during each of these steps, the substrate on which the organic photoelectric conversion layer has been formed is subjected to the heating steps.

As described above, if processing methods which are generally used for Si devices are applied to the production of the solid-state imaging device using an organic photoelectric conversion layer in order to produce the device at a low cost, the heating steps performed at a high temperature are required, and the organic photoelectric conversion layer needs to be resistant to those high-temperature processes.

Conventionally, as disclosed in JP 2008-288253 A, after a photoelectric conversion film containing an organic photoelectric conversion material such as an organic semiconductor is formed, in order to improve the photoelectric conversion efficiency and durability of the photoelectric conversion film, an annealing processing that heats the photoelectric conversion film is performed. If subjected to the annealing processing while being exposed, the photoelectric conversion film is altered. For example, concavities and convexities are formed on the exposed surface of the photoelectric conversion film, hence smoothness of an upper electrode formed thereon is impaired. In order to maintain the smoothness, the annealing temperature needs to be lowered. However, in doing so, great improvement of characteristics of the photoelectric conversion film cannot be expected, and the annealing takes up a lot of time, whereby the production cost also increases. For this reason, JP 2008-288253 A discloses processing in which, before the annealing processing is performed, an alteration-preventing film is formed on the surface of the photoelectric conversion film by being caused to come into close contact with the surface so as to prevent the photoelectric conversion film from being altered by the annealing processing, and the annealing processing is performed in this state.

However, JP 2008-288253 A does not make mention of a case where the photoelectric conversion film may be altered by the annealing processing even if the alteration-preventing film is formed on the photoelectric conversion film.

As means for improving heat resistance of the organic film, generally, materials that undergo a small thermal change are used. However, it is very difficult to find materials that demonstrate sufficient performance, and thus there are extreme difficulties in developing an organic film having heat resistance in addition to demonstrating sufficient performance.

An object of the present invention is to solve the aforementioned problems that the conventional technique has and to provide a solid-state imaging device having a high degree of heat resistance.

In order to attain the above-described object, the present invention provides a solid-state imaging device in which lower electrodes acting as pixel electrodes, an organic photoelectric conversion film formed on the lower electrodes and generating electric charge in response to received light, and a transparent upper electrode are formed on a substrate having signal readout circuits, wherein in the organic photoelectric conversion film, a transition area having at least one of its film thickness and film quality undergone transition from a film thickness and film quality of an area corresponding to a pixel electrode area in which the lower electrodes have been formed is an area that starts from an outer edge of the organic photoelectric conversion film and ends at a point away from the outer edge by a distance of 200 µm or less.

Since the organic photoelectric conversion film is basically formed using a shadow mask method which does not require a pattering step, the transition area is practically an area that starts from the outer edge of the organic photoelectric conversion film and ends at a point away from the outer edge by a distance of 5 µm or greater. Since a thickness of the mask needs to be 10 µm or more in order to assure the processing accuracy of the mask, the transition area preferably ends at a point away from the outer edge by a distance of 10 µm or greater.

The transition area is an area that starts from the outer edge of the organic photoelectric conversion film and ends at a point away from the outer edge preferably by a distance of 100 µm or less and a distance of 10 µm or greater, and more preferably by a distance of 50 µm and a distance of 10 µm or greater.

Preferably, the transition area is an area containing two or more kinds of organic materials. Preferably, a shortest distance between an edge of the lower electrode, i.e., the pixel electrode, and a starting point of the transition area is 50 µm or greater, and more preferably a shortest distance between an edge of the lower electrode and a starting point of the transition area is 100 µm or greater and 1,000 µm or less.

For example, the transition area is an area in which the film thickness of the organic photoelectric conversion film is smaller than an average film thickness of the pixel electrode area of the organic photoelectric conversion film.

For example, the transition area is an area in which the film quality of the organic photoelectric conversion film has undergone transition from an average film quality of the pixel electrode area of the organic photoelectric conversion film.

In particular, for example, the film quality of the organic photoelectric conversion film refers to a film composition of the organic photoelectric conversion film.

For example, the transition area is an area in which the film composition of the organic photoelectric conversion film is deviated from an average film composition of the pixel electrode area of the organic photoelectric conversion film. In particular, for example, the transition area is an area in which materials composing the organic photoelectric conversion film have a concentration gradient.

In addition, corners of the outer edge of the organic photoelectric conversion film may be rounded.

According to the present invention, by setting a transition area at the edge of the film to be 200 µm or less, heat resistance of the solid-state imaging device can be improved.

BRIEF DESCRIPTION OF THE DRAWINGS

FIGS. 6A and 6B are schematic cross-sectional views showing the method for producing the solid-state imaging device according to an embodiment of the present invention in the sequence of steps. These views show steps following FIG. 5C.

DETAILED DESCRIPTION OF THE INVENTION

Hereinafter, based on preferable embodiments shown in the attached drawings, the method for producing a solid-state imaging device of the present invention will be described in detail.

Figure 1A:
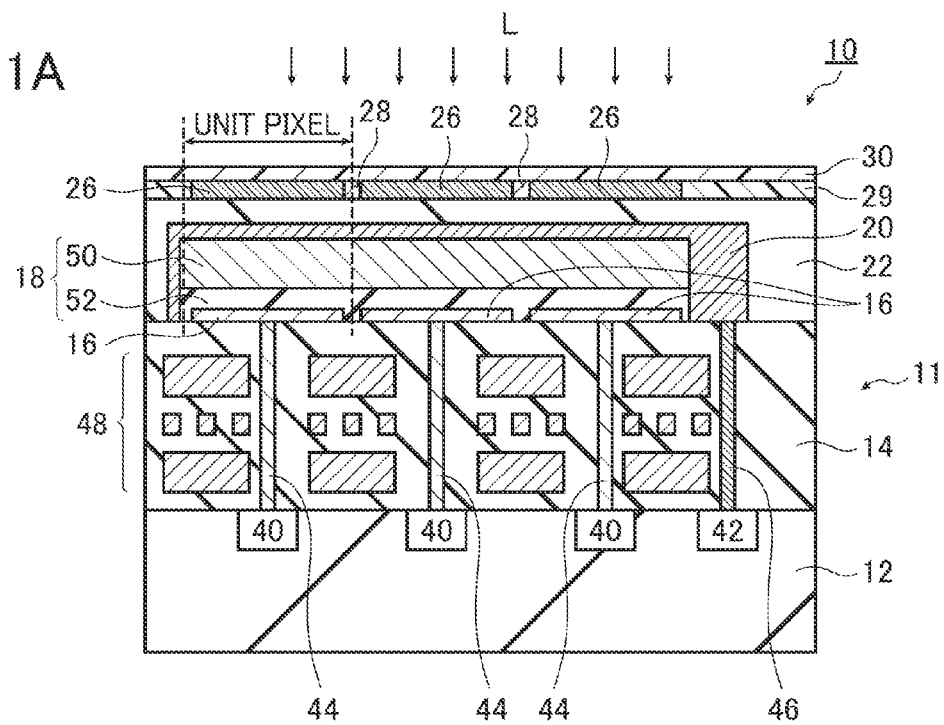
FIG. 1A is a schematic cross-sectional view showing a solid-state imaging device according to an embodiment of the present invention.
Figure 1B:
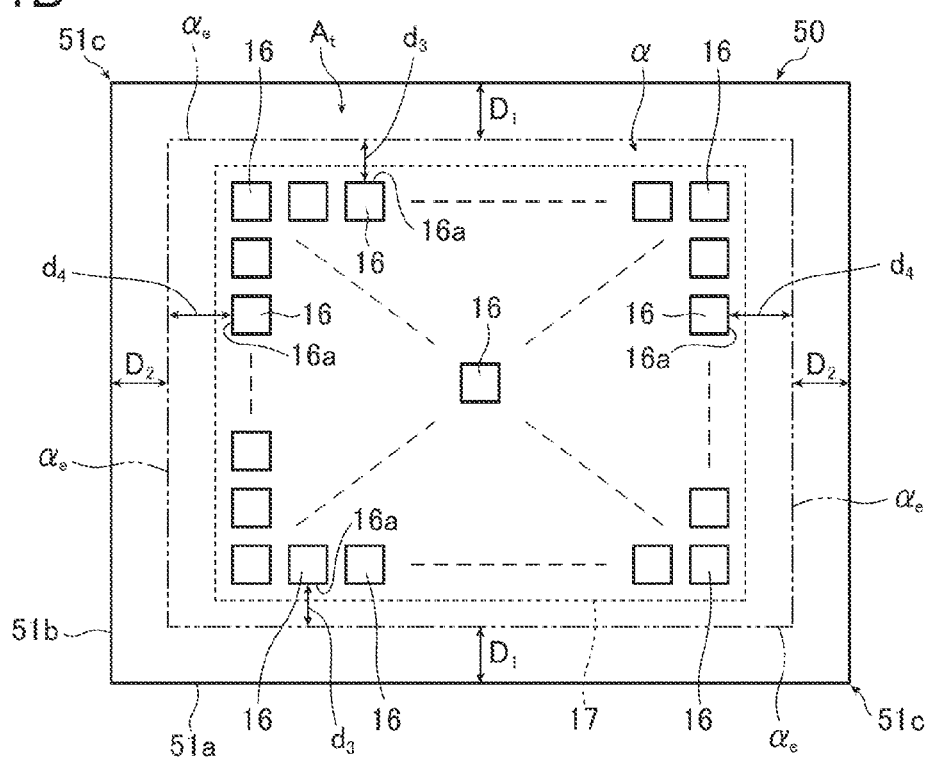
FIG. 1B is a schematic view showing how an organic photoelectric conversion layer and pixel electrodes are arranged.

FIG. 1A is a schematic cross-sectional view showing a solid-state imaging device according to an embodiment of the present invention, and FIG. 1B is a schematic view showing how an organic photoelectric conversion layer and pixel electrodes are arranged.

The imaging device according to the embodiment of the present invention can be used in imaging apparatuses such as digital cameras and digital video cameras. Moreover, the imaging device is used by being mounted on imaging modules and the like of electronic endoscopes, cellular phones, and the like.

A solid-state imaging device 10 shown in FIG. 1A has a substrate 12, an insulating layer 14, pixel electrodes (lower electrodes) 16, a photoelectric conversion portion 18, a counter electrode (upper transparent electrode) 20, a sealing layer (protective film) 22, color filters 26, partitions 28, light-shielding layer 29, and a protective layer 30.

In the substrate 12, signal readout circuits 40 and a voltage supply portion 42 supplying voltage to the counter electrode are formed.

As the substrate 12, for example, a glass substrate or a semiconductor substrate such as Si is used. On the substrate 12, the insulating layer 14 formed of a known insulating material such as $SiO_2$ is formed. On the surface of the insulating layer 14, plural pixel electrodes 16 are formed. The pixel electrodes 16 are arranged by, for example, a one-dimensional manner or a two-dimensional manner. For example, an area surrounding the entire area of the two-dimensionally arranged pixel electrodes 16 is called a pixel electrode area 17.

In the insulating layer 14, first connection portions 44 (via plugs) connecting pixel electrodes 16 to signal readout circuits 40 are formed. Moreover, in the insulating layer 14, a second connection portion 46 connecting the counter electrode 20 to the voltage supply portion 42 supplying voltage to the counter electrode is formed. The second connection portion 46 is formed in a position where it is not connected to the pixel electrodes 16 and a photoelectric conversion portion 18. The first connection portions 44 and the second connection portion 46 are formed of a conductive material.

Inside the insulating layer 14, a wiring layer 48 which is for connecting the signal readout circuits 40 and the voltage supply portion 42 to, for example, the outside of the solid-state imaging device 10 and is formed of a conductive material is formed.

As described above, a substrate obtained by forming the insulating layer 14 on the substrate 12 and forming the respective first connection portions 44, the second connection portion 46, and the wiring layer 48 on the inside of the insulating layer 14 is called a circuit board 11. The circuit board 11 is also called a CMOS substrate.

The photoelectric conversion portion 18 is formed so as to cover the plural pixel electrodes 16 except the second connection portion 46. The photoelectric conversion portion 18 has a film-like organic photoelectric conversion layer (organic photoelectric conversion film) 50 and an electron blocking layer 52.

The photoelectric conversion portion 18 is formed on the pixel electrode area 17 on the CMOS substrate (circuit board 11) by a shadow mask method. Accordingly, in the photoelectric conversion portion 18, a transition area, which will be described later, ranging from the area in which the pixel electrode area 17 is formed to the area in which the pixel electrode area 17 is not formed is created.

In the present invention, the transition area refers to an area in which at least one of film thickness and film quality has undergone transition in the organic photoelectric conversion layer 50 (organic photoelectric conversion film). The transition area refers to an area in which the film thickness of an area not corresponding to the pixel electrode area 17 is reduced little by little, compared to the film thickness of the area corresponding to the pixel electrode area 17 (see FIG. 1B) of the organic photoelectric conversion layer (organic photoelectric conversion film). Alternatively, the transition area refers to an area in which the film of an area not corresponding to the pixel electrode area 17 is a mixed film composed of two kinds of materials mixed at a mixing ratio (composition ratio) that deviates from the film composition of an area corresponding to the pixel electrode area 17 (see FIG. 1B) of the organic photoelectric conversion layer (organic photoelectric conversion film). Herein, the film composition also includes a concentration gradient of the materials (composition) composing the organic photoelectric conversion layer (organic photoelectric conversion film).

Moreover, the film thickness and the film composition of the area corresponding to the pixel electrode area 17 (see FIG. 1B) of the organic photoelectric conversion layer (organic photoelectric conversion film) respectively refer to a value corresponding to an average of the film thickness and an average film composition of the area of the organic photoelectric conversion layer (organic photoelectric conversion film) that corresponds to the pixel electrode area 17.

The transition area of the organic photoelectric conversion layer can be identified by observing the form of the organic photoelectric conversion layer by using a microscope, and measuring the film thickness by using an atomic force microscope (AFM) and a stylus film thickness meter. That is, by the above means, a boundary portion between a film-formed area and a non-film-formed area is confirmed to differentiate the boundary of a film thickness portion, and an area where a film thickness or composition is different from that of the layer of the pixel area is differentiated, whereby the transition area can be identified. Moreover, regarding the transition area of the organic photoelectric conversion layer, alteration caused at the edge of the film can be observed by a microscope, and in addition to the observation by a microscope, the alteration can be observed by micro-Raman spectroscopy or microscopic fluorometry, whereby change in the association state can be identified from the peak shift, change in the fluorescence intensity, and the like.

For the Raman spectroscopy, similarly to the case of the alteration area of the organic photoelectric conversion layer, for example, a micro-Raman spectroscopy system (Nanofinder (registered trademark)) manufactured by TOKYO INSTRUMENTS, INC. and a Raman microscope (inVia) manufactured by Renishaw PLC can be used. As excitation light, light of wavelength of 325 nm, 532 nm, 633 nm, 785 nm, and the like can be used by being classified according to the type of sample.

Regarding the transition area relating to the film thickness of the organic photoelectric conversion layer, when it is difficult to clearly differentiate the boundary area by microscopic observation, the film thickness of the organic photoelectric conversion layer is measured, and the area taking up 3% to 97% of the film thickness of the pixel area of the organic photoelectric conversion layer is regarded as being the transition area in a strict sense.

In the photoelectric conversion portion 18, the electron blocking layer 52 is formed on the side of the pixel electrodes 16, and an organic photoelectric conversion layer 50 is formed on the electron blocking layer 52.

The electron blocking layer 52 is a layer for inhibiting electrons from being injected into the organic photoelectric conversion layer 50 from the pixel electrodes 16.

The organic photoelectric conversion layer 50 generates electric charge corresponding to the amount of the received light such as incident light L and contains an organic photoelectric conversion material. The film thickness of the organic photoelectric conversion layer 50 and the electron blocking layer 52 is constant on the pixel electrodes 16. However, as long as the conditions of a range of the transition area that are specified by the present application are satisfied, the film thickness may not be constant in other portions. When the organic photoelectric conversion layer 50 has a transition area At shown in FIG. 1B, the transition area At is an area that starts from an outer edge of the organic photoelectric conversion layer 50 and ends at a position away from the outer edge by a distance of 200 μm or less, though details of this configuration will be described later.

The counter electrode 20 is opposed to the pixel electrodes 16 and is disposed to cover the photoelectric conversion layer 50. The organic photoelectric conversion layer 50 is disposed between the pixel electrodes 16 and the counter electrode 20.

It is also preferable for the counter electrode 20 to be formed by a shadow mask method just like the photoelectric conversion portion 18. If the shadow mask method is used, a patterning step of the counter electrode 20 is not necessary.

The counter electrode 20 is configured with a conductive material exhibiting transparency with respect to the incident light so as to allow the light to enter the organic photoelectric conversion layer 50. The counter electrode 20 is electrically connected to the second connection portion 46 which is disposed outside the organic photoelectric conversion layer 50 and is connected to the voltage supply portion 42 supplying voltage to the counter electrode through the second connection portion 46.

As a material of the counter electrode 20, any of materials including ITO, IZO, $SnO_2$, antimony-doped tin oxide (ATO), ZnO, Al-doped zinc oxide (AZO), gallium-doped zinc oxide (GZO), $TiO_2$, and fluorine-doped tin oxide (FTO) is preferable.

The light transmittance of the counter electrode 20 is preferably 60% or higher, more preferably 80% or higher, even more preferably 90% or higher, and still more preferably 95% or higher in the visible ray wavelength region.

The voltage supply portion 42 supplying voltage to the counter electrode applies predetermined voltage to the counter electrode 20 through the second connection portion 46. When the voltage which should be applied to the counter electrode 20 is higher than the power supply voltage of the solid-state imaging device 10, the voltage supply portion 42 supplies the predetermined voltage by increasing the power supply voltage by using a boosting circuit such as a charge pump.

The pixel electrodes 16 are electric charge-collecting electrodes that are for collecting electric charge generated in the organic photoelectric conversion layer 50 placed between the pixel electrodes 16 and the counter electrode 20 facing the pixel electrodes 16. The pixel electrodes 16 are connected to the signal readout circuits 40 through the first connection portions 44. The signal readout circuit 40 is disposed on the substrate 12 in association with each of the plural pixel electrodes 16 and readouts the signal corresponding to the electric charge collected by the pixel electrode 16 that is in association with the signal readout circuit 40. The electric charge collected by each pixel electrode 16 is converted into a signal in the signal readout circuit 40 that is in association with each pixel. From signals obtained from plural pixels, an image is synthesized.

Examples of the material of the pixel electrodes 16 include metals, metal oxides, metal nitrides, metal borides, organic conductive compounds, mixtures of these, and the like. Specific examples thereof include conductive metal oxides such as tin oxide, zinc oxide, indium oxide, indium tin oxide (ITO), indium zinc oxide (IZO), indium tungsten oxide (IWO), and titanium oxide; metal nitrides such as titanium oxynitride ($TiN_xO_y$) and titanium nitride (TiN); metals such as gold (Au), platinum (Pt), silver (Ag), chromium (Cr), nickel (Ni), and aluminum (Al); mixtures or laminates consisting of these metals and conductive metal oxides; organic conductive compounds such as polyaniline, polythiophene, and polypyrrole; laminates consisting of these organic conductive compounds and ITO; and the like. As a material of the pixel electrodes 16, any of titanium oxynitride, titanium nitride, molybdenum nitride, tantalum nitride, and tungsten nitride is particularly preferable.

If a step difference corresponding to the film thickness of the pixel electrode 16 is steep at the edge of the pixel electrode 16, if there are marked concavities and convexities on the surface of the pixel electrode 16, or if fine dust adheres to the surface of the pixel electrode 16, the layer disposed on the pixel electrodes 16 has a film thickness smaller than a desired film thickness or cracks occur in the layer. If the counter electrode 20 is formed on the layer in such a state, due to the contact between the pixel electrodes 16 and the counter electrode 20 or concentration of electric field in the defective portion, pixel defectiveness such as increase in dark currents, a short circuit, or the like is caused. Moreover, the aforementioned defectiveness may deteriorate adhesiveness between the pixel electrodes 16 and the layer disposed on these electrodes and heat resistance of the solid-state imaging device 10.

In order to prevent the aforementioned defectiveness and improve reliability of the device, it is preferable to control a surface roughness Ra of the pixel electrodes 16 to be 0.6 nm or lower. The lower the surface roughness Ra of the pixel electrodes 16 is, the smaller the concavities and convexities on the surface thereof becomes, and accordingly, the surface flatness becomes excellent. Basically, it is preferable for the step difference corresponding to the film thickness of the pixel electrode 16 to be zero. In this case, the pixel electrodes 16 can be buried in the insulating layer 14, and then a chemical mechanical polishing (CMP) process or the like can be performed to form the pixel electrodes 16 without a step difference. Furthermore, by causing the edge of the pixel electrodes 16 to slope, the degree of step difference can be mitigated. By selecting conditions of an etching process of the pixel electrodes 16, the slope can be formed. In order to remove particles on the pixel electrodes 16, it is particularly preferable to wash the pixel electrodes 16 and the like before the electron blocking layer 52 is formed, by general washing technique that is used in the semiconductor production process.

The signal readout circuits 40 are configured with, for example, a CCD, MOS, or TFT circuit, and are shielded from light by a light-shielding layer (not shown in the drawing) disposed inside the insulating layer 14. For the readout circuits 40, it is preferable to adopt a CCD or CMOS circuit if the solid-state imaging device is used as a general image sensor. From the viewpoints of low noise and high-speed performance, it is preferable to adopt a CMOS circuit.

Moreover, though not shown in the drawing, for example, an n-region of a high concentration that is surrounded by a p-region is formed in the substrate 12. The n-region is connected to the first connection portions 44, and the signal readout circuits 40 are disposed in the p-region. The n-region functions as an electric charge accumulating portion in which the electric charge of the organic photoelectric conversion layer 50 is accumulated. By the signal readout circuits 40, the electrons or holes accumulated in the n-region are converted into signals corresponding to the amount of the electric charge, and output to the outside of the solid-state imaging device 10 through, for example, the wiring layer 48.

The sealing layer 22 is for protecting the organic photoelectric conversion layer 50 containing an organic substance from factors causing deterioration such as water molecules. The sealing layer 22 is formed to cover the counter electrode 20.

The sealing layer 22 is required to satisfy the following conditions.

First, in each step of producing the device, the sealing layer 22 needs to hinder the intrusion of factors which are contained in solutions, plasma, and the like and deteriorate organic photoelectric conversion materials so as to protect the organic photoelectric conversion layer.

Second, after the device is produced, the sealing layer 22 needs to hinder the intrusion of factors such as water molecules which deteriorate organic photoelectric conversion materials so as to prevent the organic photoelectric conversion layer 50 from deteriorating over a long period time during which the device is stored and used.

Third, at the time when the sealing layer 22 is formed, the sealing layer 22 needs not to deteriorate the organic photoelectric conversion layer that has already been formed.

Fourth, since the incident light reaches the organic photoelectric conversion layer 50 through the sealing layer 22, the sealing layer 22 should be transparent to the light of a wavelength that is detected by the organic photoelectric conversion layer 50.

The sealing layer 22 can be constituted with a thin film formed of a single material. However, if this layer has a multi-layered structure, and each of the layers is caused to function in different ways, it is possible to expect effects such as stress relaxation of the entire sealing layer 22, inhibition of occurrence of defectiveness such as cracks or pin holes caused by dust or the like rising during the production process, and ease of optimization of material development. In the sealing layer 22, the number of layers laminated is not particularly limited. For example, the sealing layer 22 has a three-layered structure consisting of a silicon oxynitride (SiON) film formed by a sputtering method, an alumina film formed by an ALD method and a silicon oxynitride film formed by a sputtering method. Herein, a CVD method can be used instead of the sputtering method.

For example, the sealing layer 22 can be formed by the following manner.

The performance of organic photoelectric conversion materials remarkably deteriorates due to factors such as water molecules causing the deterioration. Accordingly, the entire organic photoelectric conversion layer needs to be sealed by being covered with dense metal oxide film, metal nitride film, metal oxynitride film, and the like that do not allow permeation of water molecules. Conventionally, an aluminum oxide (alumina) film, a silicon oxide film, a silicon nitride film, a silicon oxynitride film, a laminate structure film of these, a laminate structure film constituted with these and an organic polymer film, and the like are formed as a sealing layer by various vacuum film formation techniques such as a CVD method, a sputtering method, an atomic layer deposition (ALD) method, and the like.

An atomic layer deposition (ALD) method is sort of a CVD method, and is a technique of forming a thin film by alternately repeating an adsorption of organic metal compound molecules, metal halide molecules, and metal hydride molecules, which are thin film materials, onto the substrate surface and a reaction of these with the substrate, and decomposition of unreacted groups contained in the above materials. When reaching the substrate surface, the thin film material is in the state of low-molecular weight material, and accordingly, a thin film can grow as long as there is an extremely small space into which the low-molecular weight material can penetrate. Consequently, the portion of step difference can be completely covered (the thickness of the thin film having grown in the portion of step difference becomes the same as the thickness of the thin film having grown in the flat portion), unlike in the conventional thin film formation method having difficulties in doing this. That is, the atomic layer deposition (ALD) method is extremely excellent in step coverage properties. Therefore, since step differences due to structures on the substrate surface, minute defectiveness on the support surface, particles adhering onto the substrate surface, and the like can be completely covered, the aforementioned portion of step difference does not become a route through which factors causing deterioration of the photoelectric conversion material intrude. When the sealing layer 22 is formed by the atomic layer deposition (ALD) method, it is possible to more effectively reduce the film thickness of the sealing layer compared to the conventional technique.

When the sealing layer 22 is formed by the atomic layer deposition method, any of the ceramics materials preferable for the sealing layer 22 can be appropriately selected. However, the materials are limited to materials which may not deteriorate the organic photoelectric conversion material and can grow into a thin film at a relatively low temperature. If alkyl aluminum or aluminum halide is used for the atomic layer deposition method, it is possible to form a dense aluminum oxide thin film at a temperature of lower than 200° C. at which the organic photoelectric conversion material does not deteriorate. Particularly, use of trimethyl aluminum is preferable since this makes it possible to form an aluminum oxide thin film even at a temperature of about 100° C. Silicon oxide or titanium oxide is also preferable since this makes it possible to form a dense thin film as the sealing layer 22 at a temperature of lower than 200° C. similarly to aluminum oxide by appropriately selecting materials.

If the thin film is formed by the atomic layer deposition (ALD) method, a thin film with excellent quality that is unsurpassed in view of step coverage properties and density can be formed at a low temperature. However, the thin film deteriorates in some cases due to chemicals used in a photolithography process. For example, an aluminum oxide thin film formed by the atomic layer deposition method is amorphous, hence the surface thereof is corroded by an alkaline solution such as a developer or stripper. In this case, a thin film having excellent chemical resistance needs to be disposed on the aluminum oxide thin film formed by the atomic layer deposition film method. That is, an auxiliary sealing layer as a functional film protecting the sealing layer 22 is necessary.

Meanwhile, in many cases, the thin film formed by a CVD method such as the atomic layer deposition method has tensile stress by which the internal stress thereof becomes extremely high. Accordingly, due to the process in which heating and cooling are intermittently repeated, such as a semiconductor production process, or due to the long-term storage and use of the thin film in a high-temperature and high-humidity atmosphere, deterioration of the thin film occurs in some cases by cracking of the thin film.

In order to overcome the aforementioned problem of the sealing layer 22 formed by the atomic layer deposition method, for example, it is preferable to adopt a configuration in which an auxiliary sealing layer, which is formed into a film by a physical vapour deposition (PVD) method such as a sputtering method or by a CVD method and contains any one of ceramics such as metal oxides, metal nitrides, and metal nitride oxides that are excellent in chemical resistance, is disposed.

The color filter 26 is formed in the position facing each of the pixel electrodes 16 on the sealing layer 22. The partition 28 is disposed between the color filters 26 on the sealing layer 22, and is for improving light transmission efficiency of the color filters 26. The light shielding layer 29 is formed on the sealing layer 22, in a position not included in the area where there are the color filters 26 and the partitions 28 (area of valid pixels). The light shielding layer 29 prevents light from entering the photoelectric conversion layer 50 formed in a position not included in the area of valid pixels.

The protective layer 30 is for protecting the color filters 26 during the steps and the like performed later, and is formed to cover the color filters 26, partitions 28, and the light shielding layer 29. The protective layer 30 is also called an over coat layer.

In the imaging device 10, one pixel electrode 16 on which the photoelectric conversion portion 18, the counter electrode 20, and the color filter 26 are formed is a unit pixel.

For the protective layer 30, polymer materials such as acrylic resins, polysiloxane-based resins, polystyrene-based resins, or fluororesins and inorganic materials such as silicon oxide or silicon nitride can be used appropriately. If photosensitive resins such as polystyrene-based resins are used, the protective layer 30 can be subjected to patterning by a photolithography method. Therefore, this is preferable since it makes it easy to use such resins as a photoresist when a peripheral portion of the light shielding layer, the sealing layer, the insulating layer, and the like on a bonding pad are opened, and to process the protective layer 30 itself into a microlens. Meanwhile, the protective layer 30 can be used as an antireflection layer, and it is preferable to form various low-refractive index materials used as the partitions 28 of the color filters 26 into a film. Moreover, in order to obtain the function of the protective layer during the steps performed later and the function of the antireflection layer, the protective layer 30 can be constituted with two or more layers composed of a combination of the above materials.

In the present embodiment, the pixel electrodes 16 are formed on the surface of the insulating layer 14. However, the present invention is not limited thereto, and the pixel electrodes 16 may be buried beneath the surface of the insulating layer 14. In addition, the imaging device has a single second connection portion 46 and a single voltage supply portion 42, but the imaging device may have a plurality of these portions. For example, if voltage is supplied to the counter electrode 20 from both ends of the counter electrode 20, it is possible to suppress a voltage drop of the counter electrode 20. The number of a set of the second connection portion 46 and the voltage supply portion 42 may be appropriately increased or decreased, in consideration of a chip area of the device.

In the process of conducting examination to improve heat resistance of the organic photoelectric conversion layer, the present inventors found that there is a mode in which alteration is caused by heating from the edge of the formed organic photoelectric conversion layer, and the degree of alteration varies with the structure of the edge of the organic photoelectric conversion layer.

The heating-induced alteration of the organic photoelectric conversion layer is caused at the edge of the organic photoelectric conversion layer, that is, in the transition area ranging from the non-pixel electrode formation area to the pixel electrode formation area, and the area where the alteration has occurred is defined as an alteration area. The alteration area gradually widens with the passage of a long time, and when it reaches the pixel electrode area, normal output cannot be obtained from the pixel electrodes. Therefore, it is preferable for the alteration area formed by heating to be small, and if the alteration area is small, the heat resistance is improved as described later in detail.

Figure 2A:
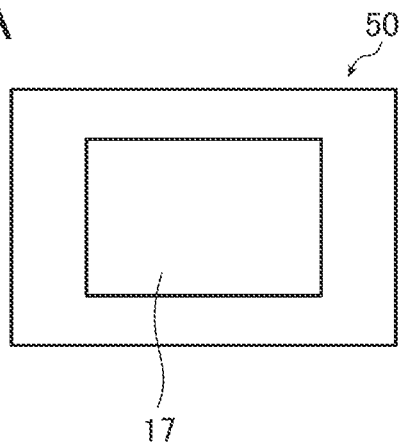
FIG. 2A is a schematic view showing the state of the formed organic photoelectric conversion layer.
Figure 2B:
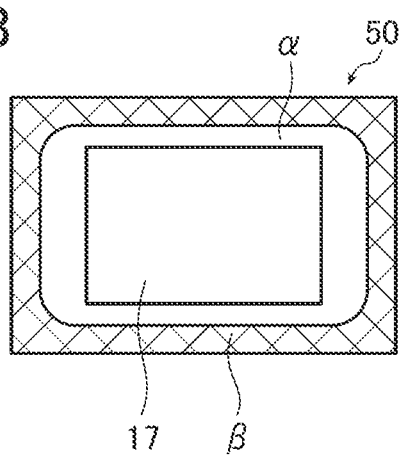
FIG. 2B is a schematic view showing the state of the organic photoelectric conversion layer having undergone heating.

Specifically, as shown in FIG. 2A, when the organic photoelectric conversion layer 50 formed on the pixel electrode area 17 is heated, the edge of the organic photoelectric conversion layer 50 is altered by heating as shown in FIG. 2B. The present inventors found that there is a deterioration mode in which when an alteration site β of the organic photoelectric conversion layer 50 that has been altered by heating reaches the pixel electrode area 17, the performance of the solid-state imaging device is altered. The alteration site β is the alteration area. The area indicated by a symbol α of FIG. 2B is an alteration-free area.

The alteration area of the organic photoelectric conversion layer can be identified by observing the organic photoelectric conversion layer with a microscope to compare the alteration area with a normal portion. Moreover, regarding the alteration area of the organic photoelectric conversion layer, in addition to the observation by a microscope, the organic photoelectric conversion layer can be observed by micro-Raman spectroscopy or microscopic fluorometry, whereby change in the association state can be identified based on the peak shift, change in the fluorescence intensity, and the like.

For the Raman spectroscopy, for example, a micro-Raman spectroscopy system (Nanofinder (registered trademark)) manufactured by TOKYO INSTRUMENTS, INC. and a Raman microscope (inVia) manufactured by Renishaw PLC can be used. As excitation light, light of wavelengths of 325 nm, 532 nm, 633 nm, 785 nm, and the like can be used by being classified according to the type of sample.

The present inventors also found that at the edge of the organic photoelectric conversion layer, the larger the area (transition area) in which the film thickness or the film quality undergoes transition from the film thickness or the film quality of the central portion of the organic photoelectric conversion layer is, the higher the degree of alteration caused by heating becomes.

Generally, it may be considered that the more gradually the transition of the film thickness or the film quality is caused in the transition area, that is, the larger the transition area is, the further the alteration of the organic photoelectric conversion layer is suppressed. However, the present inventors found that this is not the case. They found that the larger the transition area is, the larger the alteration caused by heating at the edge of the film becomes, and by setting the size of the transition area to be equal to or smaller than a certain area, the alteration area becomes smaller, whereby the heat resistance is improved.

Next, the transition area will be described.

For example, when a film as the organic photoelectric conversion layer is formed on a substrate by a vapor deposition method, and the area of the formed film is restricted by a mask method, if the substrate is caused to rotate, or if plural vapor deposition sources are provided in order to improve the film thickness distribution over the film formation area, due to a distance between the mask and the substrate or due to the structure of the mask (thickness or the like of the mask), an area in which the film thickness becomes different from that of the central portion (the site including the pixel area) is formed at the edge of the formed film.

Figure 3A:
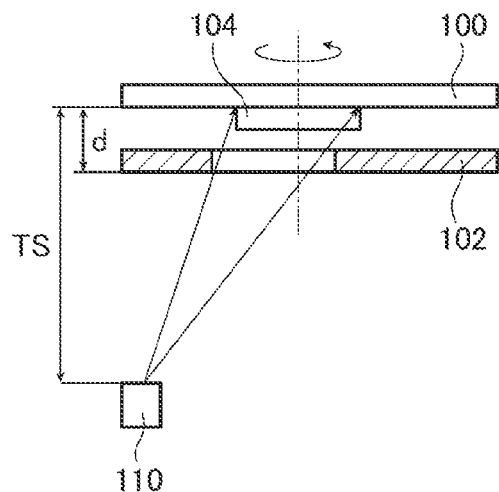
FIG. 3A is a schematic view showing an example describing how to arrange a substrate and a mask at the time of forming the organic photoelectric conversion layer.
Figure 3B:
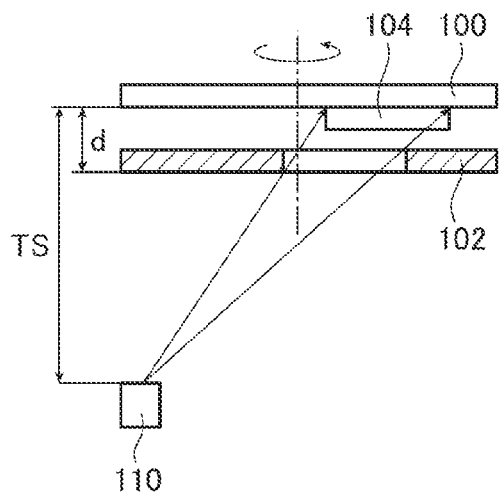
FIG. 3B is a schematic view showing another example describing how to arrange a substrate and a mask at the time of forming the organic photoelectric conversion film.
Figure 3C:
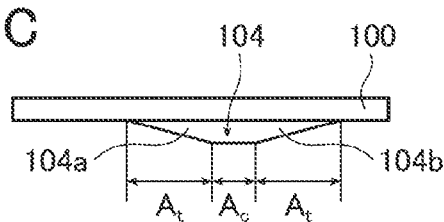
FIG. 3C is a schematic view showing the state of the organic photoelectric conversion layer formed in the manner described in FIGS. 3A and 3B.

Specifically, as shown in FIGS. 3A and 3B, when a mask 102 is disposed on a substrate 100, and an organic photoelectric conversion layer 104 is formed by using a vapor deposition source 110 while the substrate 100 is caused to rotate in order to improve the film thickness distribution over the film formation area, as shown in FIG. 3C, the film thickness of edges 104a and 104b of the organic photoelectric conversion layer 104 becomes smaller than that of a film central portion Ac (the site including the pixel area), whereby an area in which the film thickness becomes different from that of the film central portion Ac is formed. That is, this area is the transition area At.

Herein, the distance between the substrate 100 and the mask 102 is d, and the distance between the substrate 100 and the vapor deposition source 110 is TS.

Figure 4:
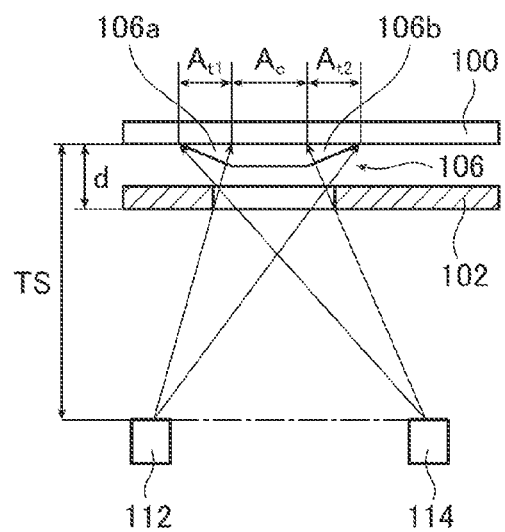
FIG. 4 is a schematic view showing an example describing how to arrange a substrate, a mask, and two vapor deposition sources at the time of forming the organic photoelectric conversion layer.

For example, as shown in FIG. 4, when two vapor deposition sources, which include a first vapor deposition source 112 and a second vapor deposition source 114 that differ from each other in terms of the vapor deposition material, are used and vapor-deposited simultaneously to form an organic photoelectric conversion layer 106, the proportion of the material of the second vapor deposition source 114 becomes higher in an edge 106a, compared to the mixing ratio (composition) of the film central portion Ac (the site including the pixel area), whereby an area having composition different from that of the film central portion Ac (the site including the pixel area) is formed. Moreover, at the edge 106b, the proportion of the material of the first vapor deposition source 112 becomes higher, whereby an area having composition different from that of the film central portion Ac (the site including the pixel area) is formed. Moreover, deviation composition in both of the edges 106a and 106b from that of the central portion becomes bigger toward the edges of the film. In the example shown in FIG. 4, the edge 106a is a transition area $At_1$, and the edge 106b is a transition area $At_2$. In this case, the distance between the substrate 100 and the first vapor deposition source 112 as well as the second vapor deposition source 114 is TS.

The reason the transition area of the organic photoelectric conversion layer 50 is likely be altered by heating is unclear. However, for example, the following is considered to be the reason. That is, if the film thickness of the organic photoelectric conversion layer 50 is uneven, the organic photoelectric conversion layer 50 may expand to different extents by heating. Consequently, thermal stress may be exerted in different ways on the organic photoelectric conversion layer 50, hence molecular motion of the material in the organic photoelectric conversion layer 50 may be promoted at the edge of the organic photoelectric conversion layer 50, that is, the molecular motion may not be easily suppressed. In addition, the following is also considered to be the reason. That is, on the organic photoelectric conversion layer 50, films as an upper electrode and a protective film are formed, hence the central portion and edge of the organic photoelectric conversion layer including the layers disposed thereon may exhibit different thermal expansion properties and be subjected to stress in different ways, whereby the alteration at the edge of the film may be promoted (the alteration may not be easily suppressed).

Furthermore, the following is also considered to be the reason. That is, when the transition area is composed in different ways (when the mixing ratio between plural materials varies), in the transition area in which, among plural materials, the proportion of a material that is easily aggregated is high, the material may tend to be more easily aggregated and changed than in the film central portion (the site including pixel area). Moreover, it is considered that when the edge of film has a concentration gradient of the composition relative to the film central portion (the site including the pixel area), the concentration gradient may become a driving force of thermal alteration, whereby the alteration is promoted.

By setting the size of the transition area to be equal to or less than a certain value of the present invention (an area that starts from an outer edge of the organic photoelectric conversion layer and ends at a position away from the outer edge by a distance of 200 μm or less), the alteration area becomes small. Consequently, a phenomenon, in which the alteration area gradually widens with the passage of a long time and reaches the pixel electrode area 17, and thus normal output cannot be obtained from the pixel electrodes 16, is suppressed, and the heat resistance can be enhanced. It is considered that by reducing the transition area, the alteration area can be reduced, and this makes it possible to suppress the growth of the alteration area which widens with increasing speed, whereby the heat resistance can be enhanced. It is also considered that the larger the transition area is, the larger the alteration area becomes, hence the alteration area grows in an instant and reaches the pixel electrode area 17.

As a result of conducting thorough examination based on the above knowledge and the like, the present inventors found that it is important for the aforementioned transition area to be 200 μm or less. Therefore, in the solid-state imaging device 10, as shown in FIG. 1B, the transition area At of the organic photoelectric conversion layer 50 is set to be 200 μm or less.

The transition area At is an area that starts from the respective edge sides (outer edges) 51a and 51b of the organic photoelectric conversion layer 50 toward the direction orthogonal to each of the edge sides 51a and 51b (i.e., toward the inner side of the organic photoelectric conversion layer 50).

Moreover, "the transition area At is 200 μm or less" means that distances $D_1$ and $D_2$ between each of the edge sides (outer edges) 51a and 51b of the organic photoelectric conversion layer 50 and the positions at which the transition area At ends in a direction (inner side) orthogonal to 51a and 51b are 200 μm or less. A normal organic photoelectric conversion film (organic photoelectric conversion layer 50) is formed to have a margin extending to the outside of the pixel electrode area 17, and the transition area At is present starting from the edge of the normal organic photoelectric conversion film toward the outer edge. The shortest distance between an edge 16a of the pixel electrode 16 and the starting point of the transition area At is preferably 50 μm or greater and more preferably from 100 μm to 1,000 μm.

In FIG. 1B, the aforementioned shortest distance is distances $d_3$ and $d_4$ between the edge 16a of the pixel electrode 16 and an outer border $α_e$ of an alteration-free area α that extends to the outside.

For forming the organic photoelectric conversion layer 50, when masks having different sizes are used for each layer, discontinuous transition areas are formed in some cases instead of a continuous transition area. However, when at least one of the film thickness and the film quality is different from that of the pixel electrode area, the transition areas are regarded as being a transition area as a whole.

In the example shown in FIG. 1B, within the alteration-free area α, the pixel electrode area 17 formed by two-dimensionally arranging plural pixel electrodes 16 is positioned, and the transition area At does not reach the pixel electrodes 16.

In the present invention, the transition area At is preferably 100 μm or less and more preferably 50 μm or less. If the transition area At exceeds 200 μm, good heat resistance cannot be obtained in the solid-state imaging device 10.

The basic idea of the present invention is to form the organic photoelectric conversion film (organic photoelectric conversion layer 50) by a shadow mask method that does not require a patterning step. Therefore, the transition area At is 5 μm or greater. Preferably, since the working accuracy of the mask needs to be maintained, the thickness of the mask needs to be 10 μm or greater. Accordingly, the transition area At is preferably 10 μm or greater.

For the above reasons, the transition area At is an area which starts from the outer edge of the organic photoelectric conversion layer 50 and ends at a point away from the outer edge by a distance of 200 μm or less and 5 μm or greater, and preferably by a distance of 200 μm or less and 10 μm or greater.

The transition area At is more preferably an area which starts from the outer edge of the organic photoelectric conversion layer 50 and ends at a point away from the outer edge by a distance of 100 μm or less and 10 μm or greater, and even more preferably an area which starts from the outer edge of the organic photoelectric conversion layer 50 and ends at a point away from the outer edge by a distance of 50 μm or less and 10 μm or greater.

For example, on one wafer, plural solid-state imaging devices 10 are formed. In this case, each of the solid-state imaging devices 10 is provided with the organic photoelectric conversion layer 50, and the aforementioned transition area At is specified for each of the organic photoelectric conversion layer 50.

As a result of thorough examination, the present inventors found that alteration starting from the aforementioned transition area particularly is likely to occur from a corner 51c of the transition area At shown in FIG. 1B. Accordingly, it is desirable to round the corner 51c of the transition area At such that the organic photoelectric conversion layer 50 does not have a sharp corner 51c at the edge thereof.

Moreover, in order to prevent the corner 51c of the transition area At from becoming an acute angle, it is also preferable to make the corner 51c of the transition area At have a structure for widening the film formation area.

The reason the alteration starts from the corner is unclear. However, the following is considered to be the reason. That is, the corner of the organic film is disposed in a state where an upper film, for example, a protective film to be formed on the organic film, comes into close contact with a substrate not via the organic film. In other words, the corner of the organic film is in a state of being surrounded by the upper film. Consequently, the corner of the organic film may become a site that is easily influenced by thermal expansion of the upper film, and for example, may become a site that is easily subjected to stress.

Figure 2C:
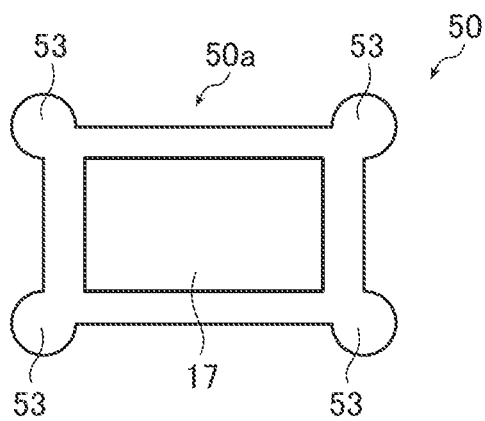
FIG. 2C is a schematic view showing an example of the organic photoelectric conversion layer.

As the structure for widening the film formation area, for example, the structure of an organic photoelectric conversion layer 50a in which a corner 53 has a shape approximate to a circle as shown in FIG. 2C is considered.

The present inventors also found that the alteration starting from the aforementioned transition area depends on the type of films, for example, an upper electrode and a sealing layer (protective film) laminated as an upper layer over the organic photoelectric conversion layer 50. Specifically, as the film thickness of the sealing layer (protective film) is smaller, the coefficient of thermal expansion thereof is smaller, or alternatively, the stress thereof is smaller, the alteration starting from the transition area becomes smaller. The reason the alteration depends on the type of the films laminated as the upper layer is unclear. However, the following is considered to be the reason. That is, the smaller the film thickness is, the smaller the volume of thermal expansion becomes, and thus the force applied to the organic film is reduced, whereby the alteration does not easily occur. Moreover, since probability of the force being applied to the film is determined by the difference in the coefficient of thermal expansion between the substrate and the upper layer, it is preferable for the coefficient of thermal expansion of the upper layer to be about equivalent to that of the substrate.

Furthermore, the higher the heat resistance of the organic photoelectric conversion layer 50 is, the more difficult it is for the alteration starting from the transition area to occur. For example, the higher the glass transition temperature (Tg) of the material used for the organic photoelectric conversion layer 50 is, the more difficult it is for the alteration to occur. This is because when energy is applied to the film from the outside, molecules move more easily (for example, molecules are easily associated), and as a result, the film is likely to be altered, that is, the alteration caused in the transition area also easily occurs. The thermal stability of the film depends on how easily the molecules move, and accordingly, for example, the higher the Tg is, the more difficult it is for the alteration to occur.

Next, a method for producing the solid-state imaging device 10 according to an embodiment of the present invention will be described.

Figure 5A:
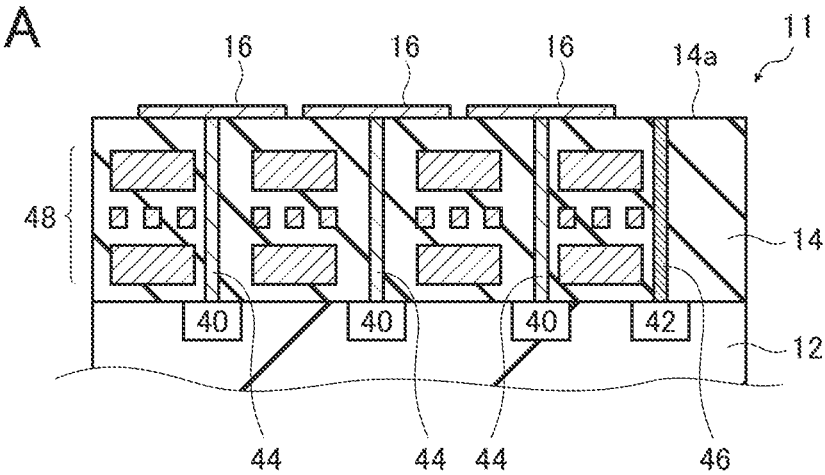
FIGS. 5A to 5C are schematic cross-sectional view showing a method for producing the solid-state imaging device according to an embodiment of the present invention in the sequence of steps.
Figure 5B:
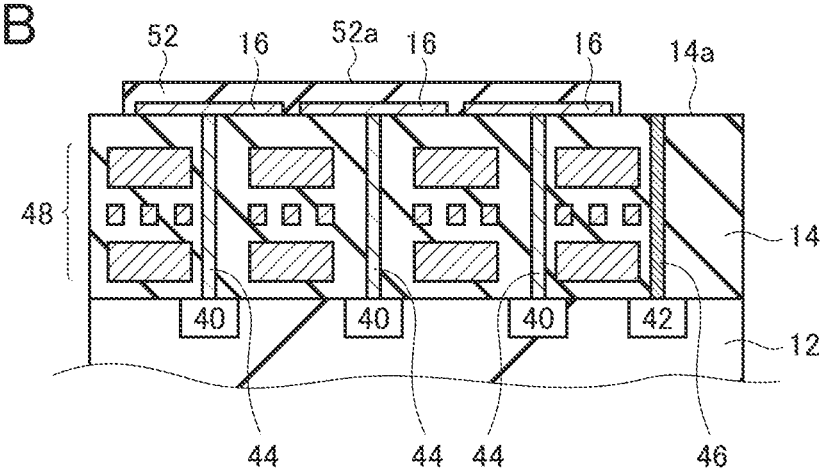
Figure 5C:
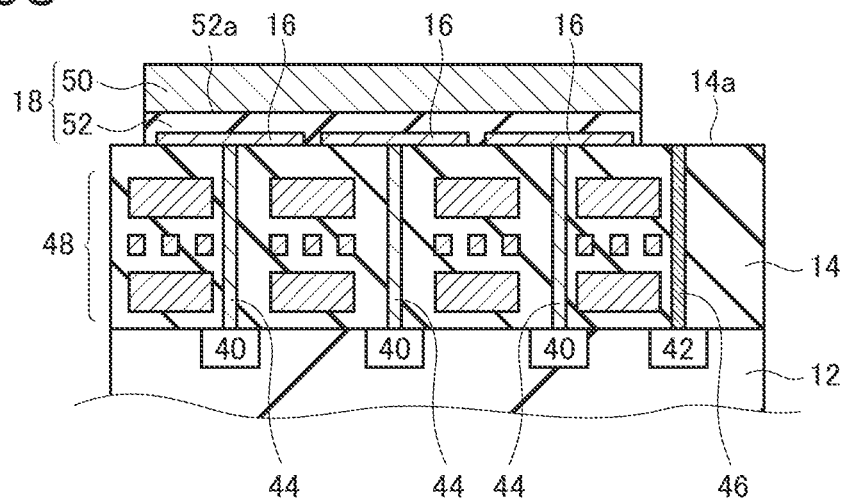

FIGS. 5A to 5C are schematic cross-sectional views showing a method for producing the solid-state imaging device according to an embodiment of the present invention in the sequence of steps. FIGS. 6A and 6B are schematic cross-sectional views showing the method for producing the solid-state imaging device according to an embodiment of the present invention in the sequence of steps. These views show steps following FIG. 5C.

In the method for producing the solid-state imaging device 10 according to an embodiment of the present invention, first, as shown in FIG. 5A, a material obtained by forming the insulating layer 14 provided with the first connection portions 44, the second connection portion 46, and the wiring layer 48 on the substrate 12 on which the signal readout circuits 40 and the voltage supply portion 42 supplying voltage to the counter electrode 20 have been formed is prepared. In this case, as described above, the first connection portions 44 are connected to the signal readout circuits 40, and the second connection portion 46 is connected to the voltage supply portion 42.

On the surface 14a of the insulating layer 14 of the circuit board 11, a titanium oxynitride ($TiN_xO_y$) film is formed by using, for example, a sputtering method. Thereafter, the titanium oxynitride film is subjected to patterning to form the pattern of the pixel electrodes 16, thereby forming the pixel electrodes 16.

Thereafter, the resultant is transported to a film formation chamber (not shown in the drawing) for forming the electron blocking layer 52 by predetermined transport means, and as shown in FIG. 5D, an electron blocking material is formed into a film through a metal mask by, for example, vapor deposition method in a vacuum of a predetermined degree to form the electron blocking layer 52 such that the electron blocking layer 52 covers the entire pixel electrodes 16 except the top of the second connection portion 46. As the electron blocking material, for example, a carbazole derivative is used, and more preferably a bifluorene derivative is used.

Subsequently, the resultant is transported to a film formation chamber (not shown in the drawing) for forming the organic photoelectric conversion layer 50 by predetermined transport means, and, as shown in FIG. 5C, photoelectric conversion materials are deposited onto a surface 52a of the electron blocking layer 52 through a metal mask in a vacuum of a predetermined degree by using, for example, a vapor deposition method, whereby the organic photoelectric conversion layer 50 is formed. As the photoelectric conversion materials, for example, a p-type organic semiconductor material and fullerene or a fullerene derivative are used. In this manner, the photoelectric conversion layer 50 is formed to form the photoelectric conversion portion 18.

Then, the resultant is transported to a film formation chamber (not shown in the drawing) for forming the counter electrode 20 by predetermined transport means. Thereafter, as shown in FIG. 6A, the counter electrode 20 is formed through a metal mask, for example, in a vacuum of a predetermined degree by using a sputtering method. The counter electrode 20 is formed in a pattern that covers the photoelectric conversion portion 18 and is formed on the second connection portion 46.

In the formation of the counter electrode 20, as the transparent conductive oxide, for example, ITO is used.

Subsequently, the resultant is transported along a predetermined transport path to a film formation chamber (not shown in the drawing) for forming the sealing layer 22, and as shown in FIG. 6B, on the surface 14a of the insulating layer 14, a laminate film having a three-layered structure consisting of a silicon oxynitride film, an alumina film, and a silicon oxynitride film is formed as the sealing layer 22 so as to cover the counter electrode 20.

In this case, for example, the silicon oxynitride films are formed by using a sputtering method or a CVD method, and the alumina film is formed by using an ALD method, in a vacuum of a predetermined degree. Moreover, the sealing layer 22 may be a single-layered film.

Subsequently, on a surface 22a of the sealing layer 22, the color filters 26, the partitions 28, and the light-shielding layer 29 are formed by using, for example, a photolithography method. For the color filters 26, the partitions 28, and the light-shielding layer 29, known materials used in organic solid-state imaging devices are used. The step of forming the color filters 26, the partitions 28, and the light-shielding layer 29 may be performed in a vacuum of a predetermined degree or performed in a non-vacuum environment.

Then, the protective layer 30 which covers the color filters 26, the partitions 28, and the light-shielding layer 29 is formed by using, for example, a coating method. In this manner, the solid-state imaging device 10 shown in FIG. 4 can be formed. For the protective layer 30, known material used in organic solid-state imaging devices is used. The step of forming the protective layer 30 may be performed in a vacuum of a predetermined degree or performed in a non-vacuum environment.

Next, the organic photoelectric conversion layer 50 and the electron blocking layer 52 constituting the photoelectric conversion portion 18 will be described in more detail.

The organic photoelectric conversion layer 50 is constituted in the same manner as the aforementioned organic photoelectric conversion layer. The organic photoelectric conversion layer 50 contains a p-type organic semiconductor material and an n-type organic semiconductor material. By joining the p-type organic semiconductor material with the n-type organic semiconductor material to form a donor-acceptor interface, exciton dissociation efficiency can be increased. Therefore, the photoelectric conversion layer having a constitution in which the p-type organic semiconductor material is joined with the n-type organic semiconductor material realizes high photoelectric conversion efficiency. Particularly, the organic photoelectric conversion layer in which the p-type organic semiconductor material is mixed with the n-type organic semiconductor material is preferable since the junction interface is enlarged, and the photoelectric conversion efficiency is improved.

The p-type organic semiconductor material (compound) is a donor-type organic semiconductor material (compound). This material is mainly represented by a hole-transporting organic compound and refers to an organic compound that easily donates electrons. More specifically, when two organic materials are used by being brought into contact to each other, an organic compound having a smaller ionization potential is called the p-type organic semiconductor material. Accordingly, as the donor-type organic compound, any organic compounds can be used as long as they have electron-donating properties. For example, it is possible to use a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, condensed aromatic carbon ring compounds (naphthalene derivatives, anthracene derivatives, phenanthrene derivatives, tetracene derivatives, pyrene derivatives, perylene derivatives, and fluoranthene derivatives), metal complexes having nitrogen-containing heterocyclic compounds as ligands, and the like. The donor-type organic compound is not limited to these, and as described above, any of organic compounds having a smaller ionization potential compared to organic compounds used as n-type (acceptor-type) compounds may be used as the donor-type organic compound.

The n-type organic semiconductor material (compound) is an acceptor-type organic semiconductor material. This material is mainly represented by an electron-transporting organic compound and refers to an organic compound that easily accepts electrons. More specifically, when two organic compounds are used by being brought into contact to each other, an organic compound showing a higher degree of electron affinity is called the n-type organic semiconductor material. Accordingly, as the acceptor-type organic compound, any organic compounds can be used as long as they have electron-accepting properties. For example, it is possible to use condensed aromatic carbon ring compounds (naphthalene derivatives, anthracene derivatives, phenanthrene derivatives, tetracene derivatives, pyrene derivatives, perylene derivatives, and fluoranthene derivatives), 5 to 7-membered heterocyclic compounds containing nitrogen atoms, oxygen atoms, or sulphur atoms (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), a polyarylene compound, a fluorene compound, a cyclopentadiene compound, a silyl compound, metal complexes having nitrogen-containing heterocyclic compounds as ligands, and the like. The acceptor-type organic compound is not limited to these, and as described above, any of organic compounds showing a higher degree of electron affinity compared to organic compounds used as p-type (donor-type) compounds may be used as the acceptor-type organic compound.

As the p-type organic semiconductor material or the n-type organic semiconductor material, any organic dye may be used. However, preferable examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethane dyes, spiro compounds, metallocene dyes, fluorenone dyes, fulgide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, and condensed aromatic carbon ring-based dyes (naphthalene derivatives, anthracene derivatives, phenanthrene derivatives, tetracene derivatives, pyrene derivatives, perylene derivatives, and fluoranthene derivatives).

As the n-type organic semiconductor material, it is particularly preferable to use fullerene or fullerene derivatives having excellent electron transport properties. Fullerene refers to fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene, or fullerene nanotubes, and fullerene derivatives refer to compounds obtained when a substituent is added to the fullerene.

As the substituent of the fullerene derivatives, alkyl groups, aryl groups, or heterocyclic groups are preferable. As the alkyl groups, alkyl groups having 1 to 12 carbon atoms are more preferable. As the aryl and heterocyclic groups, benzene rings, naphthalene rings, anthracene rings, phenanthrene rings, fluorene rings, triphenylene rings, naphthacene rings, biphenyl rings, pyrrole rings, furan rings, thiophene rings, imidazole rings, oxazole rings, thiazole rings, pyridine rings, pyrazine rings, pyrimidine rings, pyridazine rings, indolizine rings, indole rings, benzofuran rings, benzothiophene rings, isobenzofuran rings, benzimidazole rings, imidazopyridine rings, quinolizine rings, quinoline rings, phthalazine rings, naphthyridine rings, quinoxaline rings, quinoxazoline rings, isoquinoline rings, carbazole rings, phenanthridine rings, acridine rings, phenanthroline rings, thianthrene rings, chromene rings, xanthene rings, phenoxathiin rings, phenothiazine rings, or phenazine rings are preferable, benzene rings, naphthalene rings, anthracene rings, phenanthrene rings, pyridine rings, imidazole rings, oxazole rings, or thiazole rings are more preferable, and benzene rings, naphthalene rings, or pyridine rings are particularly preferable. These may further contain a substituent, and the substituent may bind to form a ring as much as possible. Moreover, the above substituents may have plural substituents which may be the same as or different from each other. The plural substituents may bind to form a ring as much as possible.

If the organic photoelectric conversion layer 50 contains fullerene or fullerene derivatives, electrons generated by photoelectric conversion can be rapidly transported to the pixel electrodes 16 or the counter electrode 20 via fullerene molecules or fullerene derivative molecules. If the fullerene molecules or fullerene derivative molecules line up and form the pathway of electrons in this state, electron transport properties are improved, whereby high-speed responsiveness of the photoelectric conversion element can be realized. In order to achieve the above improvement, it is preferable for the organic photoelectric conversion layer to contain fullerene or fullerene derivatives in a proportion of 40% (volumetric proportion) or more. However, if the proportion of fullerene or fullerene derivatives is too high, the proportion of the p-type organic semiconductor is reduced, and the junction interface becomes small, whereby the exciton dissociation efficiency is reduced.

For the organic photoelectric conversion layer 50, it is particularly preferable to use triarylamine compounds, which are disclosed in JP 4213832 B and the like, as the p-type organic semiconductor material mixed with fullerene or fullerene derivatives, since a high SN ratio of the photoelectric conversion element can be realized. If the proportion of fullerene or fullerene derivatives in the organic photoelectric conversion layer is too high, the proportion of the arylamine compounds is reduced, and the amount of absorbed incident light decreases. Since the photoelectric conversion efficiency is reduced for this reason, it is preferable for the proportion of fullerene or fullerene derivatives contained in the organic photoelectric conversion layer to be 85% (volumetric proportion) or less.

Electron-donating organic materials can be used for the electron blocking layer 52. Specifically, as low-molecular weight materials, it is possible to use aromatic diamine compounds such as N,N-bis(3-methylphenyl)-(1,1'-biphenyl)-4,4'-diamine (TPD) or 4,4'-bis[N-(naphthyl)-N-phenylamino] biphenyl (α-NPD), oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)N-phenylamino)triphenylamine (m-MTDATA), porphyrin compounds such as porphine, tetraphenylporphyrin copper, phthalocyanine, copper phthalocyanine, and titanium phthalocyanine oxide, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, silazane derivatives, carbazole derivatives, bifluorene derivatives, and the like. As high-molecular weight materials, it is possible to use polymers such as phenylene vinylene, fluorene, carbazole, indole, pyrene, pyrrole, picoline, thiophene, acetylene, and diacetylene and derivatives of these. The compounds that are not electron-donating compounds can also be used as long as they have sufficient hole transport properties.

As the electron blocking layer 52, inorganic materials can also be used. Generally, inorganic materials have a higher dielectric constant compared to organic materials. Accordingly, when inorganic materials are used for the electron blocking layer 52, higher voltage is applied to the organic photoelectric conversion layer, hence the photoelectric conversion efficient can be improved. Examples of materials that can form the electron blocking layer 52 include calcium oxide, chromium oxide, copper-chromium oxide, manganese oxide, cobalt oxide, nickel oxide, copper oxide, copper-gallium oxide, copper-strontium oxide, niobium oxide, molybdenum oxide, copper-indium oxide, silver-indium oxide, iridium oxide, and the like.

In the electron blocking layer consisting of plural layers, it is preferable that among the plural layers, the layer adjacent to the organic photoelectric conversion layer 50 be a layer which is made of the same material as the p-type organic semiconductor contained in the organic photoelectric conversion layer 50. In this manner, if the p-type organic semiconductor is also used for the electron blocking layer 52, it is possible to inhibit an intermediate level from being formed in the interface between the photoelectric conversion layer 50 and the layer adjacent thereto, and to further suppress dark currents.

When the electron blocking layer 52 consists of a single layer, the layer can be formed of an inorganic material. Alternatively, when the electron blocking layer 52 consists of plural layers, one, two, or more layers can be formed of an inorganic material.

The present invention is basically configured as above. So far, the method for producing a solid-state imaging device according to the present invention has been described in detail. However, the present invention is not limited to the above embodiments. Needless to say, the present invention may be improved or modified in various ways, within a range that does not depart from the gist of the present invention.

EXAMPLES 1

Hereinafter, the effects of the present invention that are obtained by setting the transition area to be 200 μm or less will be described in detail.

In the present examples, solid-state imaging devices of Examples 1 to 9 and Comparative Examples 1 to 12 were prepared to confirm the effects of the present invention that are obtained by setting the transition area to be 200 μm or less.

The solid-state imaging device basically has the configuration shown in FIG. 1A. In this configuration, pixel electrodes, an electron blocking layer, an organic photoelectric conversion layer, an upper electrode and a sealing layer having a three-layered structure are formed on a CMOS substrate in this order.

Hereinafter, the solid-state imaging devices of Examples 1 to 9 and Comparative Examples 1 to 12 will be described.

Example 1

On a CMOS substrate having signal readout circuits and having a surface on which an insulating film of $SiO_2$ was formed, titanium oxynitride ($TiN_xO_y$) was formed into a film having a thickness of 15 nm by a sputtering method, and pixel electrodes were formed by a dry etching method. The pixel electrodes were electrically connected to the signal readout circuits in the substrate through via plugs. Thereafter, this substrate was heated at 300° C. for 30 minutes in the atmosphere. Subsequently, on the substrate, Compound 2 described below was formed into an electron blocking layer having a thickness of 100 nm by a heating type vacuum vapor deposition method.

Next, as an organic photoelectric conversion layer, Compound 1 described below was co-deposited with fullerene $C_{60}$ by a vacuum vapor deposition method to form a mixed film having a thickness of 400 nm, such that a ratio between Compound 1 and fullerene $C_{60}$ expressed in terms of the single film became 1:2. At this time, the distance TS was set to 250 mm, the film formation area was specified by using a mask having a thickness of 0.1 mm, and the distance between the mask and the substrate was set to 0.05 mm. The aforementioned vacuum vapor deposition was performed under such conditions while the substrate was caused to rotate at 5 rpm.

Thereafter, as an upper electrode, ITO was formed into a film having a thickness of 10 nm by a sputtering method. Moreover, on the upper electrode, as a sealing layer (protective film), a silicon oxynitride film prepared by a sputtering method and having a thickness of 100 nm, an alumina film prepared by an ALD method and having a thickness of 200 nm, and a silicon oxynitride film prepared by a sputtering method and having a thickness of 100 nm were formed in this order, thereby forming a solid-state imaging device.

Example 2

A solid-state imaging device was formed in the same manner as in Example 1, except that the distance between the mask and the substrate (see FIGS. 3A and 3B) was set to 0.2 mm.

Example 3

A solid-state imaging device was formed in the same manner as in Example 1, except that an ITO film having a thickness of 10 nm was formed as an upper electrode, and then as a sealing layer (protective film), an alumina film prepared by an ALD method and having a thickness of 200 nm and a silicon oxynitride film prepared by a sputtering method and having a thickness of 100 nm were formed.

Example 4

A solid-state imaging device was formed in the same manner as in Example 2, except that an ITO film having a thickness of 10 nm was formed as an upper electrode, and then as a sealing layer (protective film), an alumina film prepared by an ALD method and having a thickness of 200 nm and a silicon oxynitride film prepared by a sputtering method and having a thickness of 100 nm were formed.

Example 5

A solid-state imaging device was formed in the same manner as in Example 4, except that an ITO film having a thickness of 10 nm was formed as an upper electrode, and then as a sealing layer (protective film), an alumina film prepared by an ALD method and having a thickness of 30 nm and a silicon oxynitride film prepared by a sputtering method and having a thickness of 100 nm were formed.

Example 6

A solid-state imaging device was formed in the same manner as in Example 1, except that Compound 3 described below was used instead of Compound 1.

Example 7

A solid-state imaging device was formed in the same manner as in Example 2, except that Compound 3 described below was used instead of Compound 1.

Example 8

A solid-state imaging device was formed in the same manner as in Example 3, except that Compound 3 described below was used instead of Compound 1.

Example 9

A solid-state imaging device was formed in the same manner as in Example 4, except that Compound 3 described below was used instead of Compound 1.

Comparative Example 1

A solid-state imaging device was formed in the same manner as in Example 1, except that the distance between the mask and the substrate (see FIGS. 3A and 3B) was set to 0.35 mm.

Comparative Example 2

A solid-state imaging device was formed in the same manner as in Example 1, except that the distance between the mask and the substrate (see FIGS. 3A and 3B) was set to 0.55 mm.

Comparative Example 3

A solid-state imaging device was formed in the same manner as in Example 1, except that the distance between the mask and the substrate (see FIGS. 3A and 3B) was set to 0.8 mm.

Comparative Example 4

A solid-state imaging device was formed in the same manner as in Comparative Example 1, except that an ITO film having a thickness of 10 nm was formed as an upper electrode, and then as a sealing layer (protective film), an alumina film prepared by an ALD method and having a thickness of 200 nm and a silicon oxynitride film prepared by a sputtering method and having a thickness of 100 nm were formed.

Comparative Example 5

A solid-state imaging device was formed in the same manner as in Comparative Example 2, except that an ITO film having a thickness of 10 nm was formed as an upper electrode, and then as a sealing layer (protective film), an alumina film prepared by an ALD method and having a thickness of 200 nm and a silicon oxynitride film prepared by a sputtering method and having a thickness of 100 nm were formed.

Comparative Example 6

A solid-state imaging device was formed in the same manner as in Comparative Example 3, except that an ITO film having a thickness of 10 nm was formed as an upper electrode, and then as a sealing layer (protective film), an alumina film prepared by an ALD method and having a thickness of 200 nm and a silicon oxynitride film prepared by a sputtering method and having a thickness of 100 nm were formed.

Comparative Example 7

A solid-state imaging device was formed in the same manner as in Comparative Example 1, except that Compound 3 described below was used instead of Compound 1.

Comparative Example 8

A solid-state imaging device was formed in the same manner as in Comparative Example 2, except that Compound 3 described below was used instead of Compound 1.

Comparative Example 9

A solid-state imaging device was formed in the same manner as in Comparative Example 3, except that Compound 3 described below was used instead of Compound 1.

Comparative Example 10

A solid-state imaging device was formed in the same manner as in Comparative Example 4, except that Compound 3 described below was used instead of Compound 1.

Comparative Example 11

A solid-state imaging device was formed in the same manner as in Comparative Example 5, except that Compound 3 described below was used instead of Compound 1.

Comparative Example 12

A solid-state imaging device was formed in the same manner as in Comparative Example 6, except that Compound 3 described below was used instead of Compound 1.

Compound 1

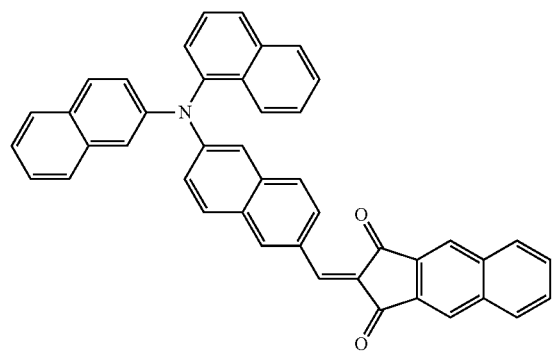

Compound 2

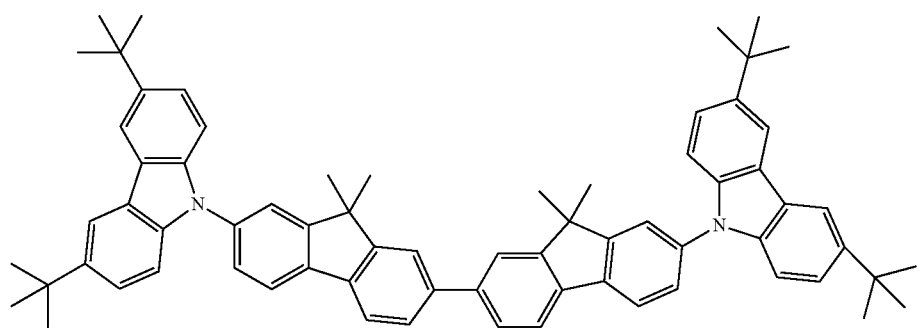

-continued

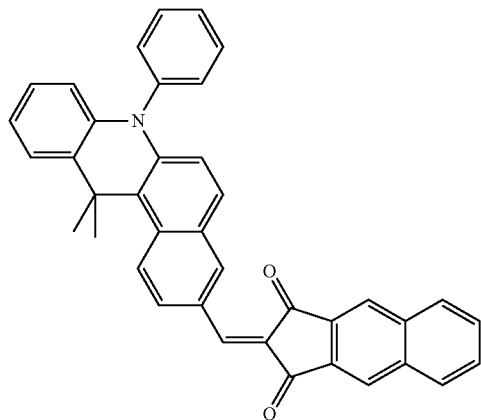

Compound 3

Figure 7:
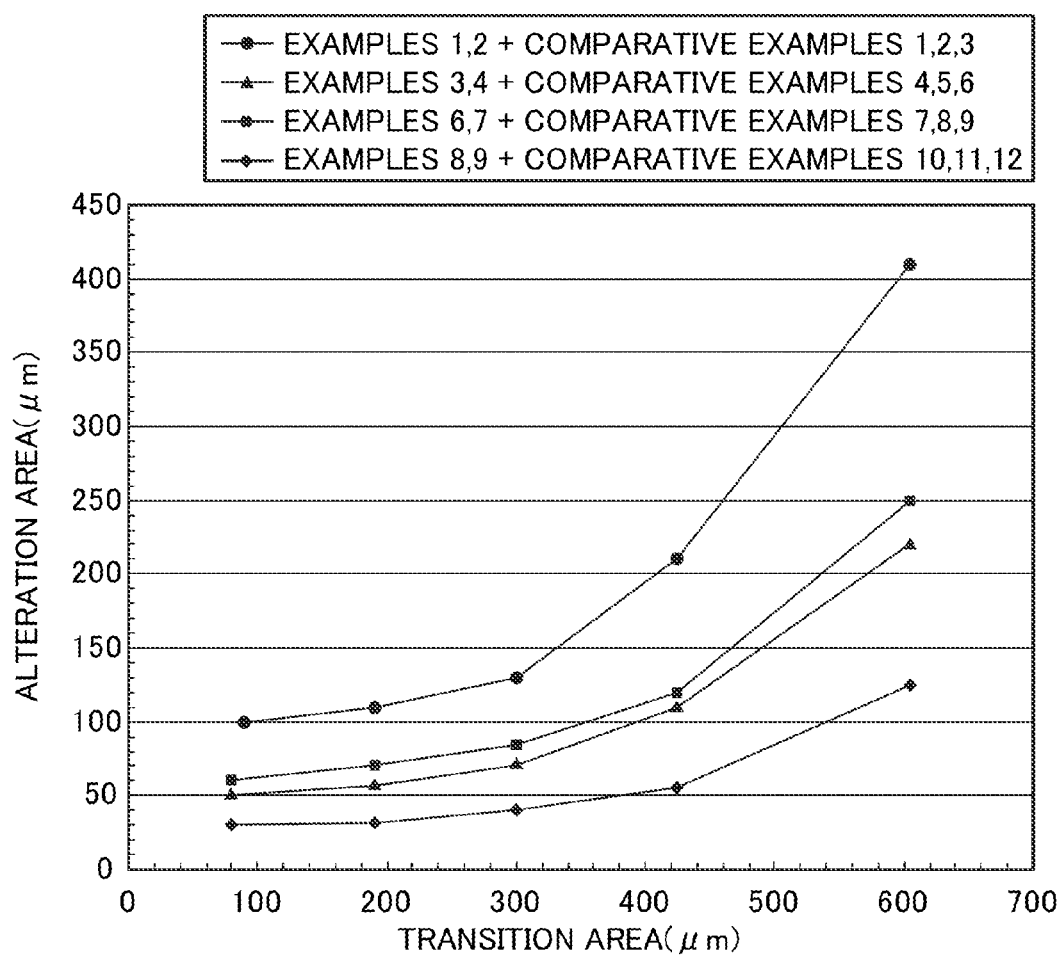
FIG. 7 is a graph showing results of the comparison of Examples 1 and 2 with Comparative Examples 1 to 3, the comparison of Examples 3 and 4 with Comparative Examples 4 to 6, the comparison between Examples 6 and 7 and Comparative Examples 7 to 9, and the comparison of Examples 8 and 9 with Comparative Examples 10 to 12.

In each of Examples 1 to 9 and Comparative Examples 1 to 12, in the organic photoelectric conversion layer, an area in which the film thickness at the edge of the film was smaller than the average film thickness of an area corresponding to the pixel electrode area, or an area in which the composition thereof was deviated from the average composition of an area corresponding to the pixel electrode area, was regarded as being a transition area and identified by being observed with an optical microscope and micro-Raman spectroscopy. Moreover, an area in which the edge of the film was altered after the organic photoelectric conversion layer was heated at 200° C. for 30 minutes was regarded as being an alteration area and identified by being observed with an optical microscope and micro-Raman spectroscopy. The following Table 1 shows the aforementioned areas that were determined for each of Examples 1 to 9 and Comparative Examples 1 to 12 and Tg of the Compounds 1 and 3 that was identified by differential scanning calorimetry (DSC). Moreover, FIG. 7 shows the results obtained from the comparison of Examples 1 and 2 with Comparative Examples 1 to 3, the comparison of Examples 3 and 4 with Comparative Examples 4 to 6, the comparison of Examples 6 and 7 with Comparative Examples 7 to 9, and the comparison of Examples 8 and 9 with Comparative Examples 10 to 12, which will be described later. FIG. 7 is a graph showing the results based on the relationship between the alteration area and the transition area.

TABLE 1

|  | Material used for photoelectric conversion layer | | Configuration of sealing layer (protective film) | Distance between substrate and mask (mm) | Transition area (mm) | Alteration area (mm) 200° C., 30 minutes |
| --- | --- | --- | --- | --- | --- | --- |
|  | Material | Tg of material (° C.) | | | | |
| Example 1 | Compound 1 | 146 | Silicon oxynitride(100 nm)/ alumina(200 nm)/ silicon oxynitride (100 nm) | 0.05 | 90 | 100 |
| Example 2 |  |  | | 0.2 | 190 | 110 |
| Comparative Example 1 |  |  | | 0.35 | 300 | 130 |
| Comparative Example 2 |  |  | | 0.55 | 425 | 210 |
| Comparative Example 3 |  |  | | 0.8 | 605 | 410 |
| Example 3 | Compound 1 | 146 | Alumina (200 nm)/ silicon oxynitride (100 nm) | 0.05 | 90 | 50 |
| Example 4 |  |  | | 0.2 | 190 | 57 |
| Comparative Example 4 |  |  | | 0.35 | 300 | 70 |
| Comparative Example 5 |  |  | | 0.55 | 425 | 110 |
| Comparative Example 6 |  |  | | 0.8 | 605 | 220 |
| Example 5 | Compound 1 | 146 | Alumina(30 nm)/ Silicon oxynitride (100 nm) | 0.2 | 190 | 41 |
| Example 6 | Compound 3 | 157 | Silicon oxynitride (100 nm)/alumina (200 nm)/silicon oxynitride(100 nm) | 0.05 | 90 | 60 |
| Example 7 |  |  | | 0.2 | 190 | 70 |
| Comparative Example 7 |  |  | | 0.35 | 300 | 85 |
| Comparative Example 8 |  |  | | 0.55 | 425 | 120 |
| Comparative Example 9 |  |  | | 0.8 | 605 | 250 |
| Example 8 | Compound 3 | 157 | Alumina (200 nm)/ silicon oxynitride (100 nm) | 0.05 | 90 | 30 |
| Example 9 |  |  | | 0.2 | 190 | 32 |
| Comparative Example 10 |  |  | | 0.35 | 300 | 40 |
| Comparative Example 11 |  |  | | 0.55 | 425 | 55 |
| Comparative Example 12 |  |  | | 0.8 | 605 | 125 |

From the comparison of Examples 1 and 2 with Comparative Examples 1 to 3, the comparison of Examples 3 and 4 with Comparative Examples 4 to 6, the comparison of Examples 6 and 7 with Comparative Examples 7 to 9, and the comparison of Examples 8 and 9 with Comparative Examples 10 to 12, it is understood that in any comparison, when using the same material for the organic photoelectric conversion layer and using the sealing layer having the same configuration, the alteration area is rapidly enlarged if the transition area exceeds around 300 μm. That is, regardless of the material used for the organic photoelectric conversion layer, and regardless of the configuration of the sealing layer, by setting the transition area to be 200 μm or less as specified in the present application, the alteration area can be suppressed to a sufficient degree.

Moreover, from the comparison of "Examples 1 and 2 as well as Comparative Examples 1 to 3" with "Examples 3 and 4 as well as Comparative Examples 4 to 6", the comparison of "Examples 6 and 7 as well as Comparative Examples 7 to 9" with "Examples 8 and 9 as well as Comparative Examples 10 to 12", and the comparison of Example 4 with Example 5, it is also understood that when the same material is used for the organic photoelectric conversion layer in the same range of the transition area, the smaller the film thickness of the protective film is, the further the range of the alteration area is suppressed.

Further, from the comparison of "Examples 1 and 2 as well as Comparative Examples 1 to 3" with "Examples 6 and 7 as well as Comparative Examples 7 to 9", and the comparison of "Examples 3 and 4 as well as Comparative Examples 4 to 6" with "Examples 8 and 9 as well as Comparative Examples 10 to 12", it is understood that when the same configuration is used for the protective layer in the same range of the transition area, the higher the Tg of the material used for the organic photoelectric conversion layer is, the further the range of the alteration area is suppressed.

As described above, it is understood that by specifying the transition area as described in the present invention, a solid-state imaging device having excellent heat resistance can be realized.

EXAMPLES 2

In the present examples, solid-state imaging devices of Examples 10 to 13 were prepared to confirm the effects of the present invention that are obtained by setting the transition area to be 200 μm or less and by specifying the shortest distance between the edge of the pixel electrode and the starting point of the transition area.

The solid-state imaging device basically has the configuration shown in FIG. 1A. In this configuration, pixel electrodes, an electron blocking layer, an organic photoelectric conversion layer, an upper electrode and a sealing layer having a three-layered structure are formed on a CMOS substrate in this order.

Hereinafter, the solid-state imaging devices of Examples 10 to 13 will be described.

Example 10

On a CMOS substrate having signal readout circuits and having a surface on which an insulating film of $SiO_2$ was formed, titanium oxynitride ($TiN_xO_y$) was formed into a film having a thickness of 15 nm by a sputtering method, and pixel electrodes were formed by a dry etching method. The pixel electrodes were electrically connected to the signal readout circuits in the substrate through via plugs. Thereafter, this substrate was heated at 300° C. for 30 minutes in the atmosphere. Subsequently, on the substrate, the aforementioned Compound 2 was formed into an electron blocking layer having a thickness of 30 nm by a heating type vacuum vapor deposition method.

Next, as an organic photoelectric conversion layer, the aforementioned Compound 3 (Tg=157° C.) was co-deposited with fullerene $C_{60}$ by a vacuum vapor deposition method to form a mixed film having a thickness of 470 nm, such that a ratio between Compound 3 and fullerene $C_{60}$ expressed in terms of the single film became 1:3. At this time, the distance TS was set to 250 mm, the film formation area was specified by using a mask having a thickness of 0.1 mm, and the distance between the mask and the substrate was set to 0.05 mm. The aforementioned vapor deposition was performed under such conditions while the substrate was caused to rotate at 5 rpm. The size of the mask was adjusted such that the shortest distance between the edge of the pixel electrode and the starting point of the transition area became 35 μm.

Thereafter, as an upper electrode, ITO was formed into a film having a thickness of 10 nm by a sputtering method. Moreover, on the upper electrode, as a sealing layer (protective film), an alumina film prepared by a sputtering method and having a thickness of 30 nm and a silicon oxynitride film prepared by a PECVD method and having a thickness of 200 nm were formed in this order, thereby forming a solid-state imaging device.

Example 11

A solid-state imaging device was formed in the same manner as in Example 10, except that the size of the mask was adjusted such that the shortest distance between the edge of the pixel electrode and the starting point of the transition area became 60 μm.

Example 12

A solid-state imaging device was formed in the same manner as in Example 10, except that the size of the mask was adjusted such that the shortest distance between the edge of the pixel electrode and the starting point of the transition area became 120 μm.

Example 13

A solid-state imaging device was formed in the same manner as in Example 10, except that the size of the mask was adjusted such that the shortest distance between the edge of the pixel electrode and the starting point of the transition area became 250 μm.

In each of Examples 10 to 13, in the organic photoelectric conversion layer, an area in which the film thickness at the edge of the film was smaller than the average film thickness of an area corresponding to the pixel electrode area, or an area in which the composition thereof was deviated from the average composition of an area corresponding to the pixel electrode area, was regarded as being a transition area and was identified by being observed with an optical microscope and micro-Raman spectroscopy. Moreover, an area in which the edge of the film was altered after the organic photoelectric conversion layer was heated at 200° C. for 30 minutes was regarded as being an alteration area and identified by being observed with an optical microscope and micro-Raman spectroscopy. Further, an area in which the edge of the film was altered after the organic photoelectric conversion layer was heated at 235° C. for 30 minutes was regarded as being an alteration area and identified by being observed with an optical microscope and micro-Raman spectroscopy. In addition, an area in which the edge of the film was altered after the organic photoelectric conversion layer was heated at 270° C. for 30 minutes was regarded as being an alteration area and identified by being observed with an optical microscope and micro-Raman spectroscopy. The following Table 2 shows the aforementioned areas determined in each of Examples 10 to 13.

TABLE 2

|  | Distance between substrate and mask (mm) | Shortest distance between edge of pixel electrode and starting point of transition area (μm) | Transition area (μm) | Alteration area (μm) 200° C., 30 minutes | Alteration area (μm) 235° C., 30 minutes | Alteration area (μm) 270° C., 30 minutes |
| --- | --- | --- | --- | --- | --- | --- |
| Example 10 | 0.05 | 35 | 90 | 25 | The entire organic photoelectric conversion layer including pixel area was altered | Experiment was cancelled. |
| Example 11 | 0.05 | 60 | 90 | 25 | 140 (Linear streaks indicating alteration that reaches pixel electrode area were observed.) | The entire organic photoelectric conversion layer including pixel area was altered |
| Example 12 | 0.05 | 120 | 90 | 25 | 140 | The entire organic photoelectric conversion layer including pixel area was altered |
| Example 13 | 0.05 | 250 | 90 | 25 | 140 | The entire organic photoelectric conversion layer including pixel area was altered |

From the comparison among Examples 10 to 13, it is understood that by setting the transition area to be 200 μm or less and further by setting the shortest distance between the edge of the pixel electrode and the starting point of the transition area to be 50 μm or greater and furthermore to be 100 μm or greater, the alteration area is reduced, and the solid-state imaging device can exhibit thermal resistance to a higher temperature.

The above results also show that by specifying the transition area as described in the present invention, a solid-state imaging device having excellent heat resistance can be realized.

What is claimed is:

1. A solid-state imaging device in which lower electrodes acting as pixel electrodes, an organic photoelectric conversion film formed on the lower electrodes and generating electric charge in response to received light, and a transparent upper electrode are formed on a substrate having signal readout circuits,
wherein in the organic photoelectric conversion film, a transition area having at least one of its film thickness and film quality undergone transition from a film thickness and film quality of an area corresponding to a pixel electrode area in which the lower electrodes have been formed is an area that starts from an outer edge of the organic photoelectric conversion film and ends at a point away from the outer edge by a distance of 5 to 200 μm, and
wherein the distance is in a plane that is parallel to a surface of the organic photoelectric conversion film.

2. The solid-state imaging device according to claim 1, wherein the transition area is an area containing two or more kinds of organic materials.

3. The solid-state imaging device according to claim 1, wherein a shortest distance between an edge of the lower electrode and a starting point of the transition area is 50 μm or greater.

4. The solid-state imaging device according to claim 1, wherein a shortest distance between an edge of the lower electrode and a starting point of the transition area is 100 μm or greater and 1,000 μm or less.

5. The solid-state imaging device according to claim 1, wherein the transition area is an area altered by heating.

6. The solid-state imaging device according to claim 1, wherein the transition area is an area in which the film thickness of the organic photoelectric conversion film is smaller than an average film thickness of the pixel electrode area of the organic photoelectric conversion film.

7. The solid-state imaging device according to claim 1, wherein the transition area is an area in which the film quality of the organic photoelectric conversion film has undergone transition from an average film quality of the pixel electrode area of the organic photoelectric conversion film.

8. The solid-state imaging device according to claim 7, wherein the film quality of the organic photoelectric conversion film refers to a film composition of the organic photoelectric conversion film.

9. The solid-state imaging device according to claim 8, wherein the transition area is an area in which the film composition of the organic photoelectric conversion film is deviated from an average film composition of the pixel electrode area of the organic photoelectric conversion film.

10. The solid-state imaging device according to claim 8, wherein the transition area is an area in which materials composing the organic photoelectric conversion film have a concentration gradient.

11. The solid-state imaging device according to claim 1, wherein the transition area is an area that starts from the outer edge of the organic photoelectric conversion film and ends at a point away from the outer edge by a distance of 100 μm or less and a distance of 10 μm or greater.

12. The solid-state imaging device according to claim 11, wherein the transition area is an area that starts from the outer edge of the organic photoelectric conversion film and ends at a point away from the outer edge by a distance of 50 μm or less and a distance of 10 μm or greater.

13. The solid-state imaging device according to claim 1, wherein corners of the outer edge of the organic photoelectric conversion film are rounded.

14. The solid-state imaging device according to claim 1, wherein the organic photoelectric conversion film consists of an alteration-free area that is the area corresponding to the pixel electrode area in which the lower electrodes have been formed, and the transition area.

* * * * *